United States Patent [19]

Takano

[11] Patent Number: 5,352,919

[45] Date of Patent: Oct. 4, 1994

[54] OPTICAL INTEGRATED SEMICONDUCTOR DEVICE

[75] Inventor: Shinji Takano, Tokyo, Japan

[73] Assignee: NEC Corporation, Tokyo, Japan

[21] Appl. No.: 148,367

[22] Filed: Nov. 8, 1993

[30] Foreign Application Priority Data

Nov. 13, 1992 [JP] Japan ................................. 4-303432

[51] Int. Cl.$^5$ ...................... H01L 31/12; H01L 27/14
[52] U.S. Cl. ................................. 257/431; 257/80; 257/88; 257/103
[58] Field of Search ..................... 257/431, 80, 84, 85, 257/88, 94, 103, 184

[56] References Cited

U.S. PATENT DOCUMENTS 5,262,656  11/1993  Blondeau et al. .................. 257/80

OTHER PUBLICATIONS

M. Okai et al., "Optimum design of currugation-pitch-modulated multiple-quantum-well distributed-feedback lasers for narrow spectral linewidth", OFC '91, WM3, Feb. 20, 1991.

O. Kaser, "Selective growth of InP/GaInAs in LP-MOVPE and MOMBE/CBE", Journal of Crystal Growth 107, 1991, pp. 989–998.

T. Kato et al., "Novel MQW DFB Laser Diode/modulator Integrated Light Source Using Bandgap Energy Control Epitaxial Growth Technique", ECOC '91, WeB7-1, pp. 429–432.

H. Ishii et al., "Design and Reflection Char. of Super Structure Grating (SSG)", 1992 Autumn Conference of the Institute of Electronics, Information and Communication Engineers, C-152, pp. 4-174-4-175.

E. Colas et al., "Lateral and longitudinal patterning . . . –masked GaAs substrates: application to thickness-modulated waveguide structures", Journal of Crystal Growth 107, 1991, pp. 226–230.

H. Nishihara, "Integrated-optical techniques using diffraction gratings", The Journal of the Applied Physics, vol. 61, No. 1, 1992, pp. 2–13.

Primary Examiner—Mark V. Prenty
Attorney, Agent, or Firm—Sughrue, Mion, Zinn, Macpeak & Seas

[57] ABSTRACT

An optical integrated semiconductor device includes a semiconductor substrate, a diffraction grating formed on the semiconductor substrate, an optical waveguide layer deposited on the semiconductor substrate, and at least one of a light-emitting element and a light-detecting element formed on the semiconductor substrate. At least one of the thickness and refractive index of the optical waveguide layer has a value which varies depending on the position in the semiconductor substrate. The optical waveguide layer, the light-emitting element, and the light-detecting element are preferably formed by selective area growth employing vapor-phase epitaxy. The diffraction grating preferably has a constant period. Preferably, the semiconductor substrate is made of InP and the optical waveguide layer is made of $In_XGa_{1-X}As_YP_{1-Y}$ where X and Y have values ranging from 0 to 1.

4 Claims, 5 Drawing Sheets

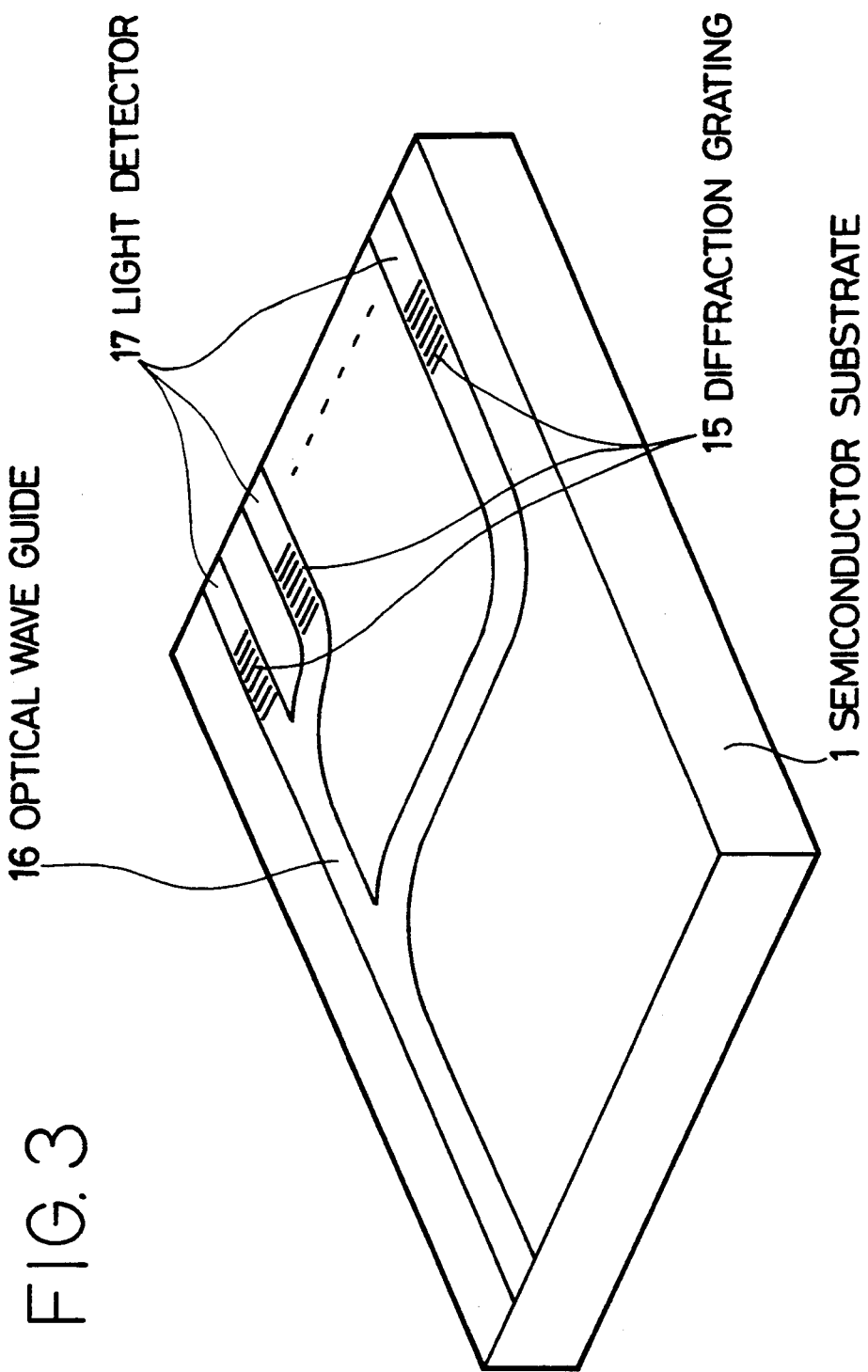

OPTICAL INTEGRATED SEMICONDUCTOR DEVICE

BACKGROUND OF THE INVENTION

1. Field of the Invention

The present invention relates to an optical integrated semiconductor device, and more particularly to an optical integrated semiconductor device which is fabricated by way of vapor-phase epitaxial growth such as metal organic vapor phase epitaxy (MOVPE) or molecular beam epitaxy (MBE).

2. Description of the Related Art

Optical technology finds more and more applications for meeting requirements for higher operation speeds and larger data-handling capabilities in communications systems for data transmission and exchange and also in information processing systems. Research and development efforts are being made to fabricate various optical devices for use in such applications. The advance in the vapor phase epitaxial growth process has enabled the fabrication of multi-quantum well devices, surface-emitting laser diodes, optical integrated semiconductor devices and ultra high-speed optical semiconductor devices capable of handling data at a rate in excess of 2 Gb/s.

Known ultra high-speed optical semiconductor devices include distributed feedback laser diodes (DFB LD) and distributed Bragg reflector diodes (DBR LD). Of particular interest among these known ultra high-speed optical semiconductor devices is a λ/4-shift DFB LD in which light is shifted in phase by π/2 at the center of the device so as to enable stable single-longitudinal-mode oscillation at the Bragg wavelength even under high-speed direct modulation. Such a phase-shift structure diffraction grating may be fabricated by photolithography or may be replicated from a mechanically engraved master. However, highly sophisticated techniques and know-how are required to fabricate those devices. It has been reported by M. Okai in WM3, Optical Fiber Communication Conference (OFC) held in 1991 in the U.S., that the spatial hole-burning which is problematic in ordinary phase-shift DFB LDs is improved in a corrugation pitch- modulated (CPM) DFB LD.

Generally, it is possible to provide diffraction gratings with a variety of complex wavefront conversion functions. Therefore, diffraction gratings can be integrated by combining such complex wavefront conversion functions. The diffraction gratings have special shapes including circular, curved, and irregularly periodic shapes. Heretofore, fabricating a partial diffraction grating for integration has required complex and sophisticated processes such as computer-controlled electron beam processes for drawing the required patterns.

In recent years, the rapid development of thin-film crystal epitaxial growth processes including MOVPE and MBE has permitted the fabrication of a semiconductor hetero-interface which has a distinct composition changes as accurate as the thickness of an atomic monolayer. Potential wells and superlattice structures formed by such a hereto-interface have peculiar optical and electric characteristics arising from the wave function of electrons. Many research and development efforts are directed to the application of such potential wells and superlattice structures to actual devices. For example, O. Kayset has reported in detail selective growth using a mask of $SiO_2$ in The Journal of Crystal Growth, 107 (1991), pp. 989–998. An optical integrated modulator DFB LD based on the application of a selective growth mechanism has been reported by T. Karo, et al. in Web7-1 in European Conference on Optical Communication (ECOC '91).

Sophisticated fabrication techniques are required to fabricate the diffraction gratings of periodically modulated configurations or special shapes including curved and irregularly periodic shapes, and processes of fabricating these devices are highly complex. Accordingly, it has been very difficult to fabricate optical integrated semiconductor devices which incorporate complex diffraction gratings and optical semiconductor devices.

SUMMARY OF THE INVENTION

It is therefore an object of the present invention to provide an optical integrated semiconductor device which is capable of incorporating a diffraction grating of a complex irregularly periodic shape or a special shape and an optical semiconductor device.

According to the present invention, there is provided an optical integrated semiconductor device comprising a semiconductor substrate, a diffraction grating formed on the semiconductor substrate, an optical waveguide layer deposited on the semiconductor substrate, and at least one of a light-emitting element and a light-detecting element formed on the semiconductor substrate, the optical waveguide layer having a thickness and a refractive index in the semiconductor substrate, at least one of the thickness and the refractive index having a value which varies depending on the position in the semiconductor substrate.

The optical waveguide layer, the light-emitting element, and the light-detecting element are preferably formed by selective area growth employing vapor-phase epitaxy.

The diffraction grating preferably has a constant period.

The semiconductor substrate is preferably made of indium phosphide InP, and the optical waveguide layer is preferably made of indium gallium arsenide phosphide $In_XGa_{1-X}As_YP_{1-Y}$, where X, Y have a value ranging from 0 to 1.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 3 is a perspective view of a semiconductor substrate of an optical integrated semiconductor device according to a second embodiment of the present invention;

DETAILED DESCRIPTION OF THE PREFERRED EMBODIMENTS

Figure 4A:
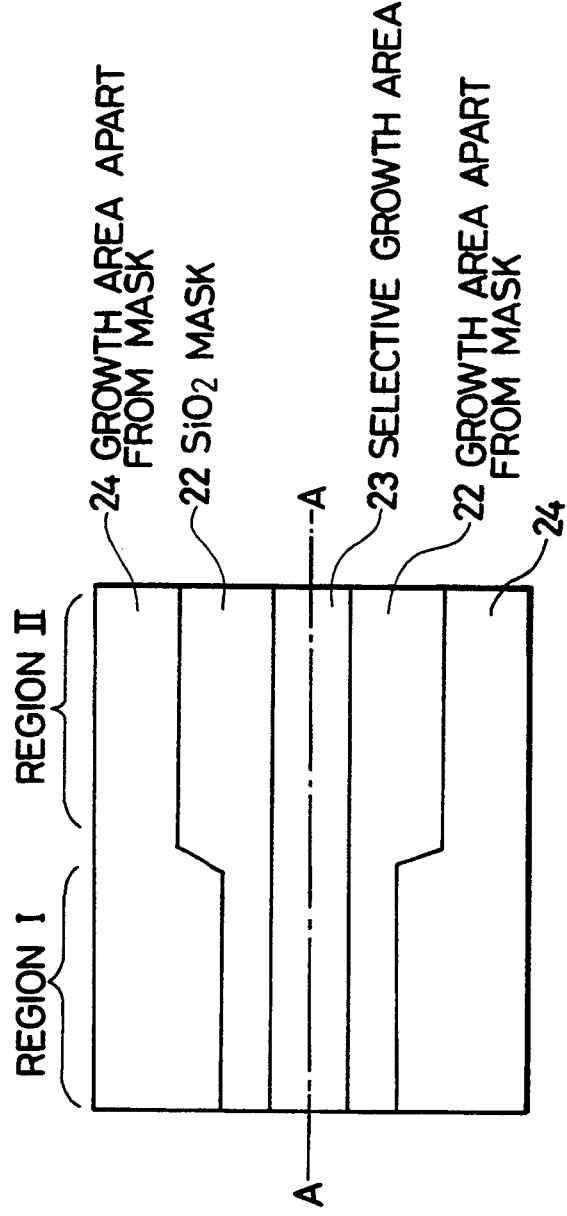
FIG. 4A is a plan view of an optical integrated semiconductor device illustrative of the principles of the present invention.
Figure 4B:
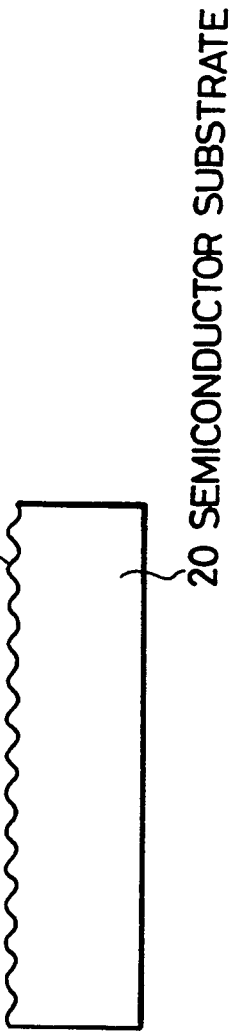
FIG. 4B is a cross-sectional view taken along line A—A of FIG. 4A.

The principles of the present invention will first be described. As shown in FIGS. 4A and 4B, a thin film of $SiO_2$ (silicon dioxide) is deposited on a semiconductor substrate 20 of InP (indium phosphide) with a diffraction grating 21 formed thereon which has a constant period, and then patterned to form a mask 22 of $SiO_2$. The mask 22 of $SiO_2$ serves as a mask for use in crystal growth. The thickness and composition of a semiconductor layer that grows in a selective growth area 23 can be controlled by varying the width of the mask 22 of $SiO_2$.

Figure 5A:
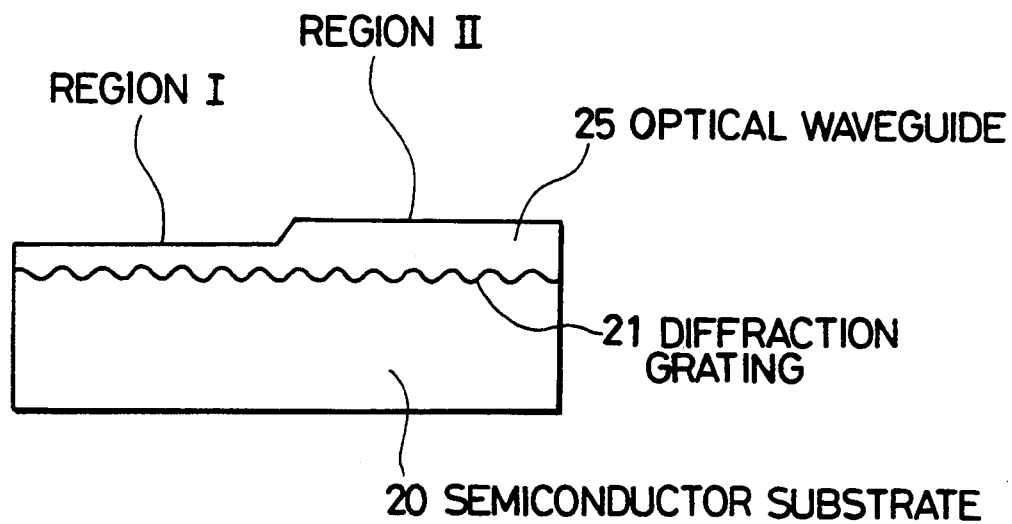
FIG. 5A is a cross-sectional view illustrative of the principles of the present invention.
Figure 5B:
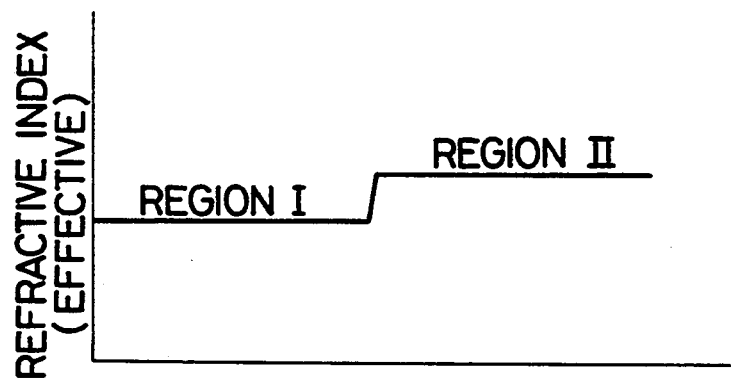
FIG. 5B is a diagram showing a refractive index distribution.

FIG. 5A present a cross-sectional view of the semi conductor substrate 20 and an optical waveguide 25 of InGaAsP (indium gallium arsenide phosphide) having a band gap wavelength $\lambda s = 1.3$ μm which is grown on the semiconductor substrate 20 by MOVPE such that lattice matching is achieved between InP and InGaAsP. A region I in the selective growth area 23 where the mask 22 is narrower has greater layer thickness and longer wavelength (smaller band gap) than a growth area 24 which sufficiently spaced from the mask 22. A region II where the mask 22 is wider has greater layer thickness and longer wavelength, i.e., a greater refractive index, as shown in FIG. 5B, than region I. Therefore, regions I and II have different effective diffraction grating periods.

Thus, at least one of the thickness index and refractive index of the optical waveguide layer is varied in the plane of the semiconductor substrate to allow the easy fabrication of a diffraction grating of a periodically modulated configuration or a special shape including a curved or irregularly periodic shape.

Figure 1:
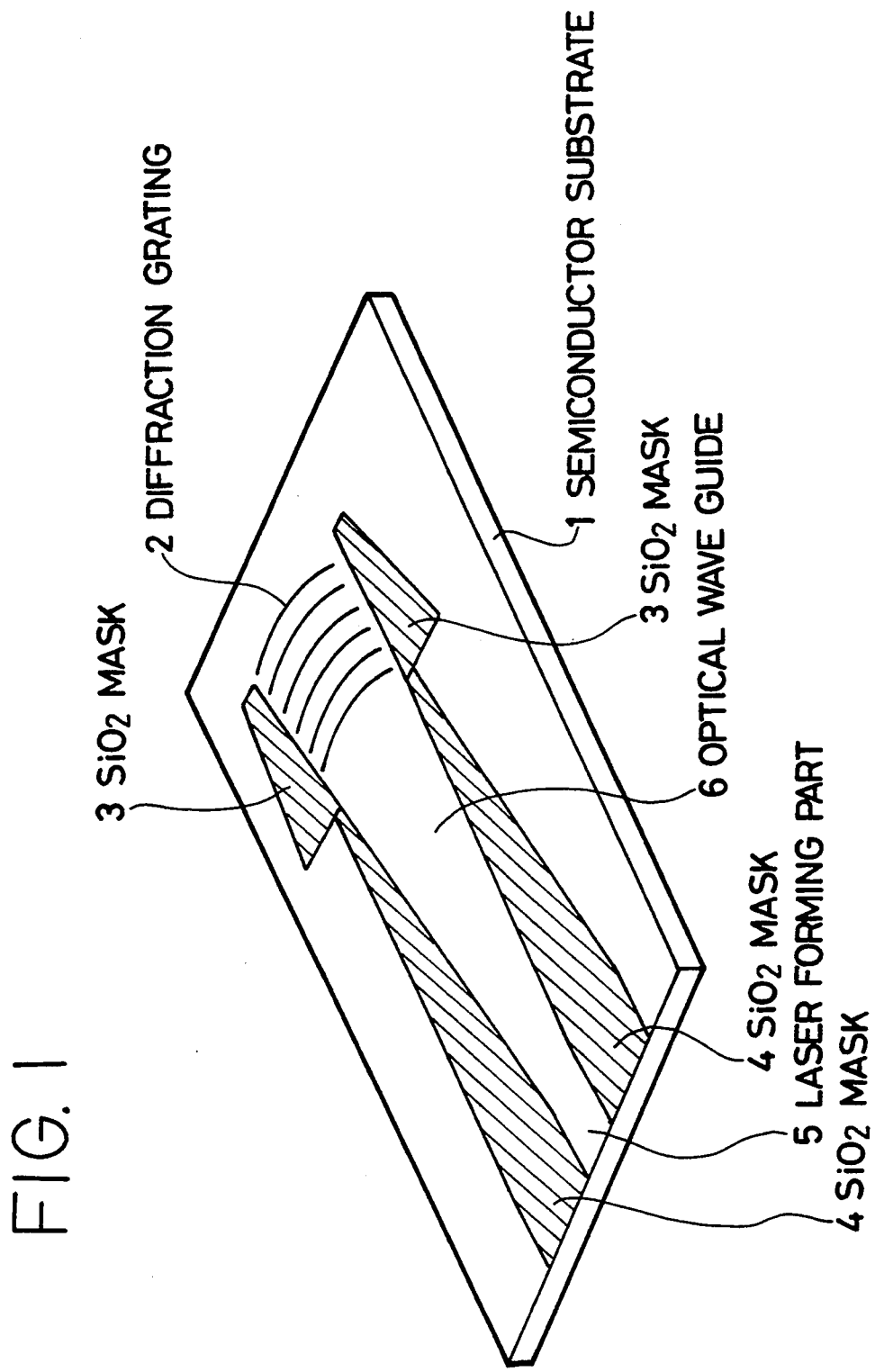
FIG. 1 is a perspective view of a semiconductor substrate of an optical integrated semiconductor device according to a first embodiment of the present invention.

FIG. 1 shows a semiconductor substrate 1 of InP of an optical integrated semiconductor device according to a first embodiment of the present invention. A diffraction grating 2 having a constant period is partially formed on the semiconductor substrate 1, and masks 3 and 4 of $SiO_2$ are also formed on the semiconductor substrate 1. The width of mask 3 varies in the direction of the corrugations of the diffraction grating 2, and the width of mask 4 is larger on opposite sides of an area 5 where a laser is to be formed and smaller on opposite sides of an area 6 where an optical waveguide 6 is to be formed.

Figure 2:
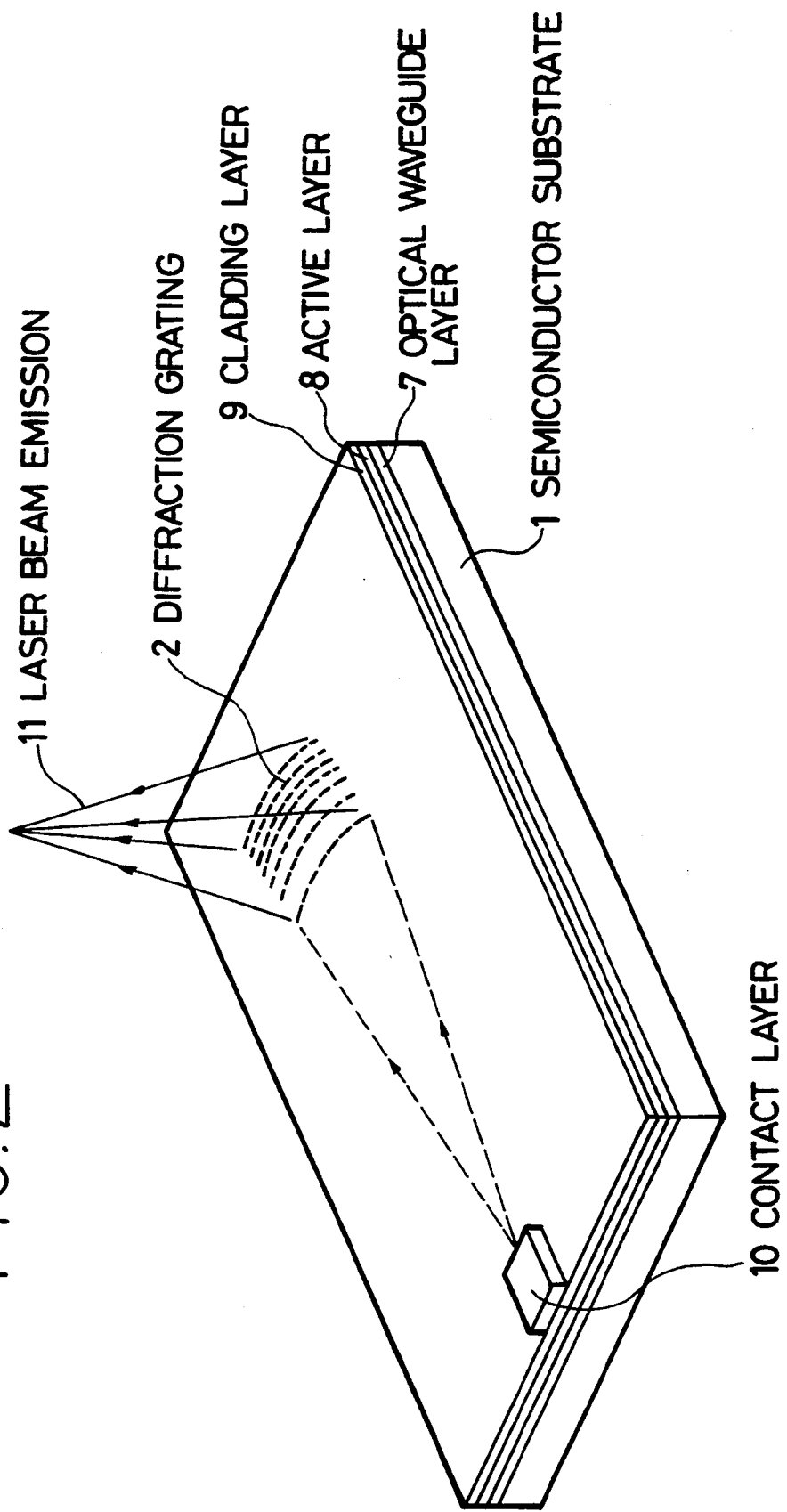
FIG. 2 is a perspective view of the optical integrated semiconductor device according to the first embodiment.

As shown in FIG. 2, the optical integrated semiconductor device includes an optical waveguide layer 7, an active layer 8 of InGaAsP, and a cladding layer 9 of p-InP that are successively deposited on the semiconductor substrate 1. The active layer 8 has a thickness of 0.12 μm and a band gap wavelength of 1.55 μm in a selective growth area. The cladding layer 9 has a thickness of 0.2 μm and a carrier density of $7 \times 10^{17}$ cm$^{-3}$ in the selective growth area. A mask of $SiO_2$ is formed on the surface formed so far except in area 5. A contact layer 10 of p-InGaAs is also deposited on the cladding layer 9, the contact layer 10 having a thickness of about 0.25 μm and a carrier density of $8 \times 10^{18}$ cm$^{-3}$. The contact layer 10 and an electrode (not shown) on the reverse side of the semiconductor substrate 1 form a semiconductor laser therebetween in area 5. A laser beam produced by the semiconductor laser travels through the optical waveguide layer 7, is diffracted substantially perpendicularly to the plane of the semiconductor substrate 1 by the diffraction grating 2, and emitted as a laser beam emission 11.

Since the semiconductor laser, the optical waveguide layer 7, and the diffraction grating 2 are integrally joined to each other, it is easy to fabricate a surface emitting laser diode. While only one semiconductor laser is shown in FIG. 2, a plurality of semiconductor lasers may be employed to form a surface emitting optical integrated semiconductor device.

FIG. 3 shows a semiconductor substrate of an optical integrated semiconductor device according to a second embodiment of the present invention. In FIG. 3, an optical waveguide layer 17 is grown on a semiconductor substrate 1 of InP on which diffraction gratings 15 having respective constant periods are partially formed. With this arrangement, it is possible to form diffraction gratings 15 having different effective periods in a plurality of optical waveguide layers. Light detectors 17 formed on the same semiconductor substrate 1 at the respective ends of the optical waveguide layers constitute an integrated light detector device with wavelength selectivity.

While the semiconductor substrate in each of the above embodiments is made of InP, the principles of the present invention are also applicable to a semiconductor substrate of GaAs.

Although certain preferred embodiments of the present invention has been shown and described in detail, it should be understood that various changes and modifications may be made therein without departing from the scope of the appended claims.

What is claimed is:

1. An optical integrated semiconductor device comprising:

a semiconductor substrate;

a diffraction grating formed on said semiconductor substrate;

an optical waveguide layer deposited on said semiconductor substrate; and at least one of a light-emitting element and a light-detecting element formed on said semiconductor substrate;

said optical waveguide layer having a thickness and a refractive index in a region where said diffraction grating is formed on said semiconductor substrate, at least one of said thickness and said refractive index having a value which varies along an optical path in said diffraction grating formed on said semiconductor substrate.

2. The optical integrated semiconductor device according to claim 1, wherein said optical waveguide layer, said light-emitting element, and said light-detecting element are formed by selective area growth employing vapor-phase epitaxy.

3. The optical integrated semiconductor device according to claim 1, wherein said diffraction grating has a constant period.

4. The optical integrated semiconductor device according to claim 1, wherein said semiconductor substrate is made of indium phosphide InP and said optical waveguide layer is made of indium gallium arsenide phosphide $In_XGa_{1-X}As_YP_{1-Y}$ where X and Y have values ranging from 0 to 1.

* * * * *